US006959256B2

(12) United States Patent
Basto

(10) Patent No.: US 6,959,256 B2
(45) Date of Patent: Oct. 25, 2005

(54) UNIVERSALLY ACCESSIBLE FULLY PROGRAMMABLE MEMORY BUILT-IN SELF-TEST (MBIST) SYSTEM AND METHOD

(75) Inventor: Luis Antonio Basto, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/776,762

(22) Filed: Feb. 11, 2004

(65) Prior Publication Data

US 2004/0230395 A1    Nov. 18, 2004

Related U.S. Application Data

(60) Provisional application No. 60/471,408, filed on May 16, 2003.

(51) Int. Cl.[7] ............................................. G06F 11/00
(52) U.S. Cl. ............................... 702/117; 711/5; 714/42
(58) Field of Search ........................ 702/117, 122, 118, 702/182–185, 188–189; 714/733, 30, 718, 714/719, 1, 5, 25, 42, 54; 716/4; 709/230, 709/250, 212; 711/115, 219, 5, 170; 438/10, 438/14, 15

(56) References Cited

U.S. PATENT DOCUMENTS 6,452,848 B1    9/2002  Obremski et al. .......... 365/201
2004/0190331 A1*   9/2004  Ross et al. .................. 365/154

* cited by examiner

*Primary Examiner*—Marc S. Hoff
*Assistant Examiner*—Edward Raymond
(74) *Attorney, Agent, or Firm*—Iandiorio & Teska

(57) ABSTRACT

A universally accessible fully programmable memory built-in self-test (MBIST) system including an MBIST controller having an address generator configured to generate addresses for a memory under test, a sequencer circuit configured to deliver test data to selected addresses of the memory under test and reading out that test data, a comparator circuit configured to compare the test data read out of the memory under test to the test data delivered to the memory under test to identify a memory failure, and an externally accessible user programmable pattern register for providing a pattern of test data to the memory under test. The system includes an external pattern programming device configured to supply the pattern of test data to the user programmable data pattern register.

17 Claims, 10 Drawing Sheets

| | Col15 | Col14 | Col13 | Col12 | Col11 | Col10 | Col9 | Col8 | Col7 | Col6 | Col5 | Col4 | Col3 | Col2 | Col1 | Col0 |
|---|---|---|---|---|---|---|---|---|---|---|---|---|---|---|---|---|
| Row15 | 1 | 0 | 1 | 0 | 1 | 0 | 1 | 0 | 1 | 0 | 1 | 0 | 1 | 0 | 1 | 0 |
| Row14 | 0 | 1 | 0 | 1 | 0 | 1 | 0 | 1 | 0 | 1 | 0 | 1 | 0 | 1 | 0 | 1 |
| Row13 | 1 | 0 | 1 | 0 | 1 | 0 | 1 | 0 | 1 | 0 | 1 | 0 | 1 | 0 | 1 | 0 |
| Row12 | 0 | 1 | 0 | 1 | 0 | 1 | 0 | 1 | 0 | 1 | 0 | 1 | 0 | 1 | 0 | 1 |
| Row11 | 1 | 0 | 1 | 0 | 1 | 0 | 1 | 0 | 1 | 0 | 1 | 0 | 1 | 0 | 1 | 0 |
| Row10 | 0 | 1 | 0 | 1 | 0 | 1 | 0 | 1 | 0 | 1 | 0 | 1 | 0 | 1 | 0 | 1 |
| Row9 | 1 | 0 | 1 | 0 | 1 | 0 | 1 | 0 | 1 | 0 | 1 | 0 | 1 | 0 | 1 | 0 |
| Row8 | 0 | 1 | 0 | 1 | 0 | 1 | 0 | 1 | 0 | 1 | 0 | 1 | 0 | 1 | 0 | 1 |
| Row7 | 1 | 0 | 1 | 0 | 1 | 0 | 1 | 0 | 1 | 0 | 1 | 0 | 1 | 0 | 1 | 0 |
| Row6 | 0 | 1 | 0 | 1 | 0 | 1 | 0 | 1 | 0 | 1 | 0 | 1 | 0 | 1 | 0 | 1 |
| Row5 | 1 | 0 | 1 | 0 | 1 | 0 | 1 | 0 | 1 | 0 | 1 | 0 | 1 | 0 | 1 | 0 |
| Row4 | 0 | 1 | 0 | 1 | 0 | 1 | 0 | 1 | 0 | 1 | 0 | 1 | 0 | 1 | 0 | 1 |
| Row3 | 1 | 0 | 1 | 0 | 1 | 0 | 1 | 0 | 1 | 0 | 1 | 0 | 1 | 0 | 1 | 0 |
| Row2 | 0 | 1 | 0 | 1 | 0 | 1 | 0 | 1 | 0 | 1 | 0 | 1 | 0 | 1 | 0 | 1 |
| Row1 | 1 | 0 | 1 | 0 | 1 | 0 | 1 | 0 | 1 | 0 | 1 | 0 | 1 | 0 | 1 | 0 |
| Row0 | 0 | 1 | 0 | 1 | 0 | 1 | 0 | 1 | 0 | 1 | 0 | 1 | 0 | 1 | 0 | 1 |

*FIG. 4A*

|  | Col15 | Col14 | Col13 | Col12 | Col11 | Col10 | Col9 | Col8 | Col7 | Col6 | Col5 | Col4 | Col3 | Col2 | Col1 | Col0 |
|---|---|---|---|---|---|---|---|---|---|---|---|---|---|---|---|---|
| Row15 | 0 | 0 | 0 | 0 | 0 | 0 | 0 | 0 | 0 | 0 | 0 | 0 | 0 | 0 | 0 | 1 |
| Row14 | 0 | 0 | 0 | 0 | 0 | 0 | 0 | 0 | 0 | 0 | 0 | 0 | 0 | 0 | 1 | 0 |
| Row13 | 0 | 0 | 0 | 0 | 0 | 0 | 0 | 0 | 0 | 0 | 0 | 0 | 0 | 1 | 0 | 0 |
| Row12 | 0 | 0 | 0 | 0 | 0 | 0 | 0 | 0 | 0 | 0 | 0 | 0 | 1 | 0 | 0 | 0 |
| Row11 | 0 | 0 | 0 | 0 | 0 | 0 | 0 | 0 | 0 | 0 | 0 | 1 | 0 | 0 | 0 | 0 |
| Row10 | 0 | 0 | 0 | 0 | 0 | 0 | 0 | 0 | 0 | 0 | 1 | 0 | 0 | 0 | 0 | 0 |
| Row9 | 0 | 0 | 0 | 0 | 0 | 0 | 0 | 0 | 0 | 1 | 0 | 0 | 0 | 0 | 0 | 0 |
| Row8 | 0 | 0 | 0 | 0 | 0 | 0 | 0 | 0 | 1 | 0 | 0 | 0 | 0 | 0 | 0 | 0 |
| Row7 | 0 | 0 | 0 | 0 | 0 | 0 | 0 | 1 | 0 | 0 | 0 | 0 | 0 | 0 | 0 | 0 |
| Row6 | 0 | 0 | 0 | 0 | 0 | 0 | 1 | 0 | 0 | 0 | 0 | 0 | 0 | 0 | 0 | 0 |
| Row5 | 0 | 0 | 0 | 0 | 0 | 1 | 0 | 0 | 0 | 0 | 0 | 0 | 0 | 0 | 0 | 0 |
| Row4 | 0 | 0 | 0 | 0 | 1 | 0 | 0 | 0 | 0 | 0 | 0 | 0 | 0 | 0 | 0 | 0 |
| Row3 | 0 | 0 | 0 | 1 | 0 | 0 | 0 | 0 | 0 | 0 | 0 | 0 | 0 | 0 | 0 | 0 |
| Row2 | 0 | 0 | 1 | 0 | 0 | 0 | 0 | 0 | 0 | 0 | 0 | 0 | 0 | 0 | 0 | 0 |
| Row1 | 0 | 1 | 0 | 0 | 0 | 0 | 0 | 0 | 0 | 0 | 0 | 0 | 0 | 0 | 0 | 0 |
| Row0 | 1 | 0 | 0 | 0 | 0 | 0 | 0 | 0 | 0 | 0 | 0 | 0 | 0 | 0 | 0 | 0 |

*FIG. 4B*

| | Col15 | Col14 | Col13 | Col12 | Col11 | Col10 | Col9 | Col8 | Col7 | Col6 | Col5 | Col4 | Col3 | Col2 | Col1 | Col0 |
|---|---|---|---|---|---|---|---|---|---|---|---|---|---|---|---|---|
| Row15 | 0 | 0 | 0 | 0 | 0 | 0 | 0 | 0 | 1 | 1 | 1 | 1 | 1 | 1 | 1 | 1 |
| Row14 | 1 | 1 | 1 | 1 | 1 | 1 | 1 | 1 | 0 | 0 | 0 | 0 | 0 | 0 | 0 | 0 |
| Row13 | 0 | 0 | 0 | 0 | 0 | 0 | 0 | 0 | 1 | 1 | 1 | 1 | 1 | 1 | 1 | 1 |
| Row12 | 1 | 1 | 1 | 1 | 1 | 1 | 1 | 1 | 0 | 0 | 0 | 0 | 0 | 0 | 0 | 0 |
| Row11 | 0 | 0 | 0 | 0 | 0 | 0 | 0 | 0 | 1 | 1 | 1 | 1 | 1 | 1 | 1 | 1 |
| Row10 | 1 | 1 | 1 | 1 | 1 | 1 | 1 | 1 | 0 | 0 | 0 | 0 | 0 | 0 | 0 | 0 |
| Row9 | 0 | 0 | 0 | 0 | 0 | 0 | 0 | 0 | 1 | 1 | 1 | 1 | 1 | 1 | 1 | 1 |
| Row8 | 1 | 1 | 1 | 1 | 1 | 1 | 1 | 1 | 0 | 0 | 0 | 0 | 0 | 0 | 0 | 0 |
| Row7 | 0 | 0 | 0 | 0 | 0 | 0 | 0 | 0 | 1 | 1 | 1 | 1 | 1 | 1 | 1 | 1 |
| Row6 | 1 | 1 | 1 | 1 | 1 | 1 | 1 | 1 | 0 | 0 | 0 | 0 | 0 | 0 | 0 | 0 |
| Row5 | 0 | 0 | 0 | 0 | 0 | 0 | 0 | 0 | 1 | 1 | 1 | 1 | 1 | 1 | 1 | 1 |
| Row4 | 1 | 1 | 1 | 1 | 1 | 1 | 1 | 1 | 0 | 0 | 0 | 0 | 0 | 0 | 0 | 0 |
| Row3 | 0 | 0 | 0 | 0 | 0 | 0 | 0 | 0 | 1 | 1 | 1 | 1 | 1 | 1 | 1 | 1 |
| Row2 | 1 | 1 | 1 | 1 | 1 | 1 | 1 | 1 | 0 | 0 | 0 | 0 | 0 | 0 | 0 | 0 |
| Row1 | 0 | 0 | 0 | 0 | 0 | 0 | 0 | 0 | 1 | 1 | 1 | 1 | 1 | 1 | 1 | 1 |
| Row0 | 1 | 1 | 1 | 1 | 1 | 1 | 1 | 1 | 0 | 0 | 0 | 0 | 0 | 0 | 0 | 0 |

*FIG. 4C*

|  | Col15 | Col14 | Col13 | Col12 | Col11 | Col10 | Col9 | Col8 | Col7 | Col6 | Col5 | Col4 | Col3 | Col2 | Col1 | Col0 |
|---|---|---|---|---|---|---|---|---|---|---|---|---|---|---|---|---|
| Row15 | 0 | 0 | 0 | 0 | 0 | 0 | 0 | 0 | 0 | 0 | 0 | 0 | 0 | 0 | 0 | 0 |
| Row14 | 1 | 0 | 0 | 0 | 0 | 0 | 0 | 0 | 0 | 0 | 0 | 0 | 0 | 0 | 0 | 0 |
| Row13 | 1 | 1 | 0 | 0 | 0 | 0 | 0 | 0 | 0 | 0 | 0 | 0 | 0 | 0 | 0 | 0 |
| Row12 | 1 | 1 | 1 | 0 | 0 | 0 | 0 | 0 | 0 | 0 | 0 | 0 | 0 | 0 | 0 | 0 |
| Row11 | 1 | 1 | 1 | 1 | 0 | 0 | 0 | 0 | 0 | 0 | 0 | 0 | 0 | 0 | 0 | 0 |
| Row10 | 1 | 1 | 1 | 1 | 1 | 0 | 0 | 0 | 0 | 0 | 0 | 0 | 0 | 0 | 0 | 0 |
| Row9 | 1 | 1 | 1 | 1 | 1 | 1 | 0 | 0 | 0 | 0 | 0 | 0 | 0 | 0 | 0 | 0 |
| Row8 | 1 | 1 | 1 | 1 | 1 | 1 | 1 | 0 | 0 | 0 | 0 | 0 | 0 | 0 | 0 | 0 |
| Row7 | 1 | 1 | 1 | 1 | 1 | 1 | 1 | 1 | 0 | 0 | 0 | 0 | 0 | 0 | 0 | 0 |
| Row6 | 1 | 1 | 1 | 1 | 1 | 1 | 1 | 1 | 1 | 0 | 0 | 0 | 0 | 0 | 0 | 0 |
| Row5 | 1 | 1 | 1 | 1 | 1 | 1 | 1 | 1 | 1 | 1 | 0 | 0 | 0 | 0 | 0 | 0 |
| Row4 | 1 | 1 | 1 | 1 | 1 | 1 | 1 | 1 | 1 | 1 | 1 | 0 | 0 | 0 | 0 | 0 |
| Row3 | 1 | 1 | 1 | 1 | 1 | 1 | 1 | 1 | 1 | 1 | 1 | 1 | 0 | 0 | 0 | 0 |
| Row2 | 1 | 1 | 1 | 1 | 1 | 1 | 1 | 1 | 1 | 1 | 1 | 1 | 1 | 0 | 0 | 0 |
| Row1 | 1 | 1 | 1 | 1 | 1 | 1 | 1 | 1 | 1 | 1 | 1 | 1 | 1 | 1 | 0 | 0 |
| Row0 | 1 | 1 | 1 | 1 | 1 | 1 | 1 | 1 | 1 | 1 | 1 | 1 | 1 | 1 | 1 | 0 |

*FIG. 4D*

UNIVERSALLY ACCESSIBLE FULLY PROGRAMMABLE MEMORY BUILT-IN SELF-TEST (MBIST) SYSTEM AND METHOD

RELATED APPLICATIONS

This application claims priority of U.S. Provisional Application No. 60/471,408 filed May 16, 2003 incorporated by reference herein.

FIELD OF THE INVENTION

This invention relates generally to memory built-in self-test (MBIST) for testing memory and more particularly to an improved system and method for performing a MBIST which is universally accessible and fully programmable.

BACKGROUND OF THE INVENTION

Complex system-on-chip (SoC) designs, such as ASIC chips, and the like, typically contain large amounts of embedded memory. The embedded memory may be static random access memory (SRAM), dynamic random access memory (DRAM), cache, register files, and even FLASH memory. The embedded memories of the SoC chips are located internally and hence cannot be easily accessed externally for testing. As a result, MBIST systems, located on the SoC, are a common way to test the embedded memory arrays on a SoC.

A conventional MBIST design typically includes address generators, data generators, logic to sequence the addresses and write and read a test memory array to the memory being tested, and a comparator to compare the written and read test memory arrays and report the results. Typically, prior MBIST designs require some external test sequence or instruction to initiate the MBIST test, which causes the address generator and sequencer to generate and sequence addresses of a desired test data pattern which is written and read to every location of the memory being tested. The written and read data (expected data) are compared and the results are reported by a simple pass/fail status, or in more complex designs, more elaborate logic is implemented for diagnosing, debugging, and the like.

Conventional MBIST systems and methods to generate the test data patterns (also known as background patterns) include hardwiring the actual data pattern(s) with logic, storing the desired test data patterns in read only memory (ROM), and algorithmic generation of the test data patterns.

The simplest and easiest method to create a test data pattern is to hardwire logic into the MBIST controller engine to generate the desired test pattern, e.g., a checkerboard pattern of 1's and 0's, or similar data pattern(s). Logic is typically employed to write the memory address of the test data pattern generated by the hardwired logic to the memory under test. The hardwiring design requires gate logic for each desired memory test data pattern to be hardwired into the MBIST controller engine, hence, the hardwired MBIST design cannot be re-programmed or changed for different test data patterns after the SoC is manufactured.

If a large number of memory test data patterns are required, the test data patterns can be encoded in a read-only memory (ROM), which may or may not be part of the MBIST controller. The sequencer logic of the MBIST loads the test memory data pattern from the ROM to the memory being tested until all the ROM locations are exhausted. Although this design can increase the number of memory test patterns, the ROM design requires the desired test data patterns to be pre-programmed and similarly cannot be re-programmed to change the test data patterns.

Conventional MBIST algorithmic generation designs generate test data patterns by utilizing logic gates to generate the desired test data or background patterns when the MBIST is activated. Specific combinations of test data patterns can be selected at the time of MBIST activation. When the MBIST is running, the desired background patterns are dynamically generated to produce a write of the test data patterns into the memory under test. The algorithmic generation technique suffers from the distinct drawback that the desired test data patterns must be pre-generated or pre-programmed. The design is also limited to test data patterns defined by the logic gates.

One example of a more elaborate algorithmic generation design is disclosed in U.S. Pat. No. 6,452,848 entitled "Programmable Built-in Self-Test (BIST) Data Generation For Semiconductor Memory Devices", incorporated by reference herein. The '848 patent uses additional logic to generate data background patterns based on the row and column address of the memory being tested. Although the '848 patent appears to disclose a programmable memory test pattern generator, the design is limited to the test data patterns which can be generated by the extensive hardwired XOR logic gates. The design is also incapable of receiving external programming (e.g., external to the MBIST controller) to generate test data patterns. Moreover, extensive hardwired logic gates, address scramble registers, and data word registers must be incremented and/or decremented. Hence, the MBIST design of the '848 patent cannot operate at the same speed as the memory under test because of the delays created by the extensive logic gates and the delays associated with incrementing or decrementing the address and data word registers, which require at least one clock cycle.

BRIEF SUMMARY OF THE INVENTION

It is therefore an object of this invention to provide a universally accessible fully programmable memory built-in self-test (MBIST) system and method.

It is a further object of this invention to provide such a system and method which can generate any desired number of user defined test data patterns.

It is a further object of this invention to provide such a system and method which can generate any desired number of user defined test data patterns without the need for hardwiring the MBIST controller engine.

It is a further object of this invention to provide such a system and method which can generate any desired number of programmable test data patterns without the need for a ROM.

It is a further object of this invention to provide such a system and method which can generate any desired number of programmable data patterns without using algorithmic generation.

It is a further object of this invention to provide such a system and method which can externally program user defined patterns of test data.

It is a further object of this invention to provide such a system and method which can operate at the speed of the memory being tested.

The invention results from the realization that a truly innovative universally accessible fully programmable memory built-in self-test (MBIST) technique which eliminates the need to hardwire test data patterns, store the test data patterns in ROM, or utilize algorithmic generation techniques to create test data patterns, all of which require the test data or background patterns to be pre-programmed or pre-generated internally in the MBIST controller, can be achieved by generating addresses for a memory under test; delivering test data to selected addresses of the memory under test; reading out the test data from the selected addresses of the memory under test; comparing the test data read out of the memory under test to the test data delivered to the memory under test to identify a memory failure; programming a user programmable data pattern register to provide a pattern of test data to the memory under test; and generating the pattern of test data with an external pattern programming device for the user programmable data pattern register.

This invention features a universally accessible fully programmable memory built-in self-test (MBIST) system including an MBIST controller having an address generator configured to generate addresses for a memory under test, a sequencer circuit configured to deliver test data to selected addresses of the memory under test and reading out that test data, a comparator circuit configured to compare the test data read out of the memory under test to the test data delivered to the memory under test to identify a memory failure, an externally accessible user programmable pattern register for providing a pattern of test data to the memory under test; and an external pattern programming device configured to supply a pattern of test data to the user programmable data pattern register.

In one embodiment, the external programming device may include a computer configured to generate a user defined pattern of test data. The external programming device may include programmable hardware configured to generate a user defined pattern of test data. The user programmable pattern register may include FLASH memory. The universally accessible fully programmable memory built-in self-test (MBIST) system may include a switching device configured to select a computer or programmable hardware to generate a user defined pattern of data. The user programmable pattern register may serially receive the test data from the external pattern programming device. The user programmable pattern register may receive the test data from the external pattern programming device in a parallel configuration. The user programmable pattern register may include from 1 to N bits. The user programmable pattern register may be located within the MBIST controller. The user programmable pattern register may be located external to the MBIST controller. The pattern of test data may be chosen from the group consisting of a checkerboard pattern, a diagonal pattern, an all zeros pattern, an all ones pattern, a walking ones pattern, or a walking zeros pattern. The pattern of test data may be any user defined binary data pattern limited only by the size of the user programmable data register. The pattern of test data may include any user defined pattern of ones and zeros. The system may include multiplexor where a test mode signal selects the addresses generated from the address generator or system addresses based on a predetermined state of the test mode signal. The system may include a multiplexor where a test mode signal selects the pattern of test data or system data based on a predetermined state of the test mode signal.

This invention also features a universally accessible fully programmable memory built-in self-test (MBIST) system including an MBIST controller including an address generator configured to generate addresses for a memory under test, a sequencer circuit configured to deliver test data to selected addresses of the memory under test and reading out that test data, and a comparator circuit configured to compare the test data read out of the memory under test to the test data delivered to the memory under test to identify a memory failure, an externally accessible user programmable pattern register remote from the MBIST controller for providing a pattern of test data to the memory under test, and an external pattern programming device configured to provide the pattern of test data for the user programmable data pattern register.

This invention also features a universally accessible fully programmable memory built-in self-test (MBIST) method, the method including the steps of generating addresses for a memory under test, generating for an externally accessible user programmable pattern register a pattern of test data with an external pattern programming device, programming the user programmable pattern register with the pattern of test data to the memory under test, delivering test data to selected addresses of the memory under test, reading out the test data from the selected addresses of the memory under test, and comparing the test data read out of the memory under test to the test data delivered to the memory under test to identify a memory failure.

BRIEF DESCRIPTION OF THE DRAWINGS

Other objects, features and advantages will occur to those skilled in the art from the following description of a preferred embodiment and the accompanying drawings, in which:

FIGS. 4A–4D are tables showing examples of various test data patterns which may be generated in accordance with this invention.

DISCLOSURE OF THE PREFERRED EMBODIMENT

Figure 1A:
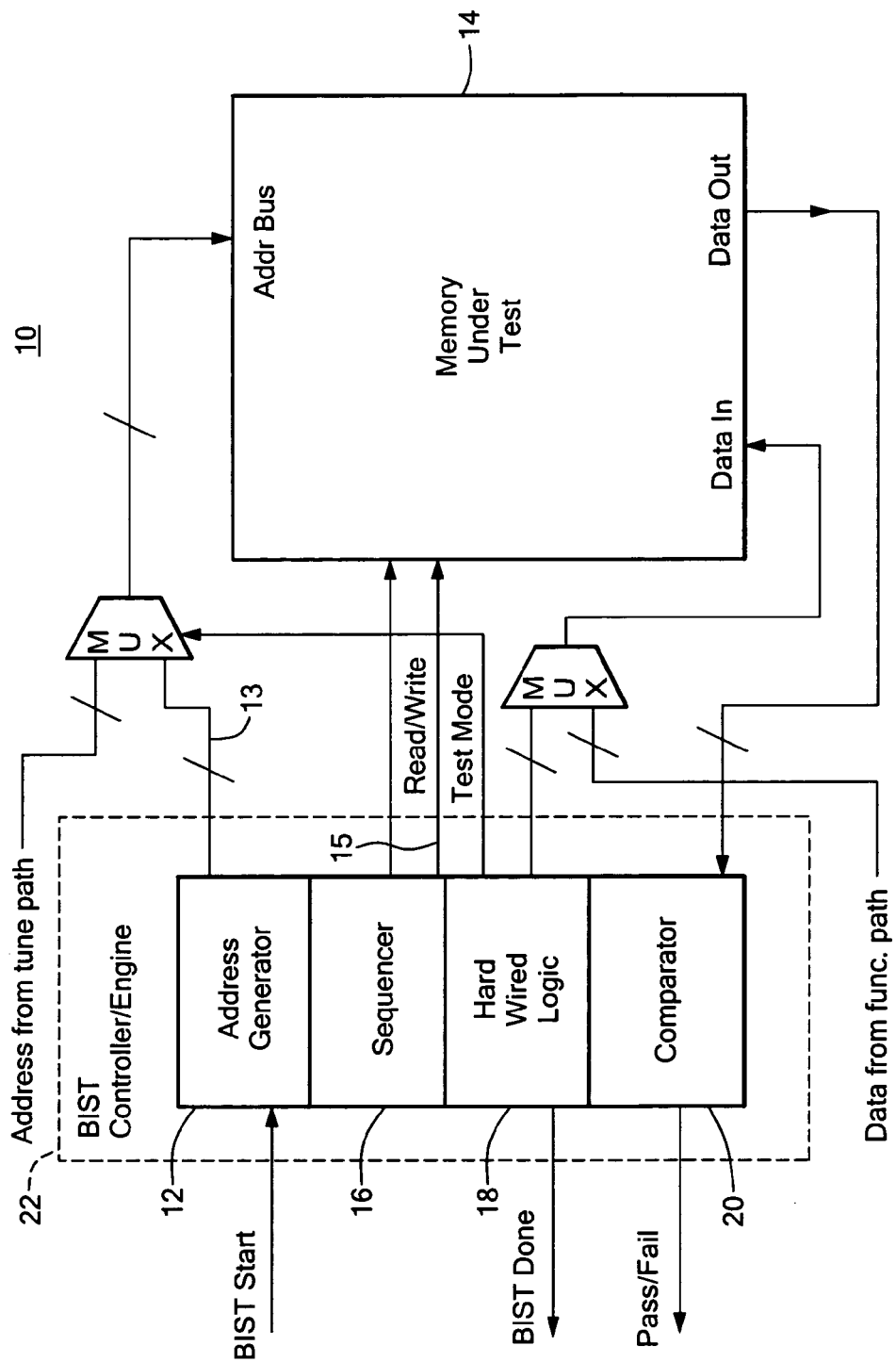
FIGS. 1A–1C are schematic block diagrams of typical prior art MBIST designs.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

As discussed in the Background section above, conventional MBIST systems and methods generate test data patterns for testing memory by hardwiring logic with the desired test data pattern(s) on the MBIST controller, storing the test data patterns in ROM, or utilizing algorithmic generation techniques to generate the desired test data patterns.

For example, prior art MBIST system 10, FIG. 1 includes address generator 12 configured to generate addresses on line 13 for memory under test 14 and sequencer 16 configured to deliver the test data pattern generated by hardwired logic 18 to memory under test 14 on line 15. Sequencer 16 reads the data pattern written to memory under test 14 on line 15 and comparator 20 compares the written and read test data patterns to memory under test 14 to identify and report a memory failure. A distinct drawback of this design is that the desired test data pattern(s) must be hardwired into hardwired logic 18 which prevents re-programming of system 10 for new or different test data patterns. Moreover, each hardwired data pattern(s) takes up valuable chip real estate, which limits the number of test data patterns which can be used.

Figure 1B:
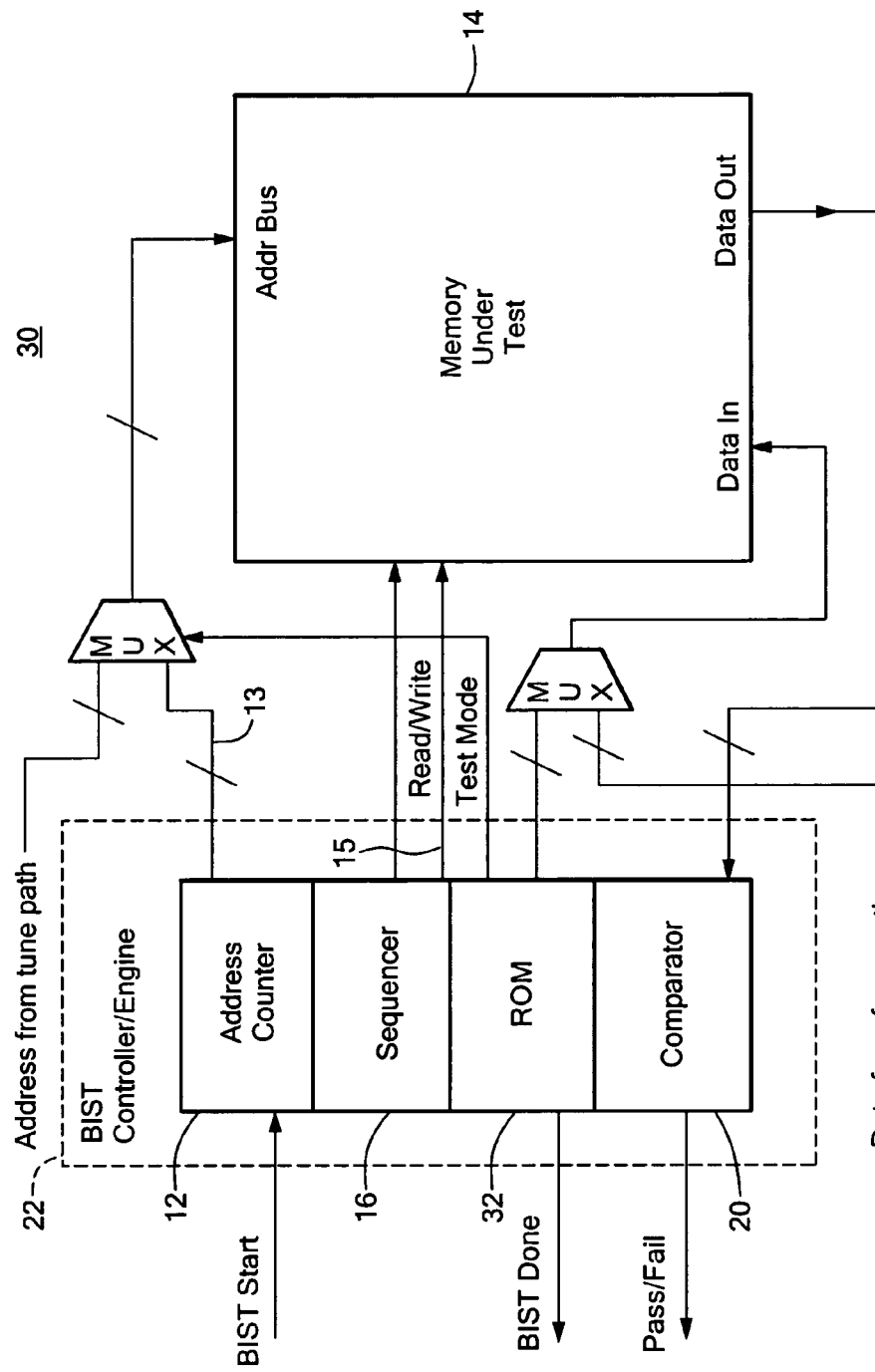

Conventional MBIST system 30, FIG. 1B, where like parts have been given like numbers, utilizes similar techniques as MBIST 10 except hardwired logic 18 is replaced with ROM 32. ROM 32 may be encoded with the desired test patterns which are read into and out of memory under test 14 by sequencer 16 on line 15 and similarly compared by comparator 20 to identify a failure. Although prior art MBIST system 30 can increase the number of test patterns to memory under test 14, the design suffers from the distinct drawback that the ROM cannot be re-programmed to change the desired test patterns once MBIST system 30 is manufactured.

Figure 1C:
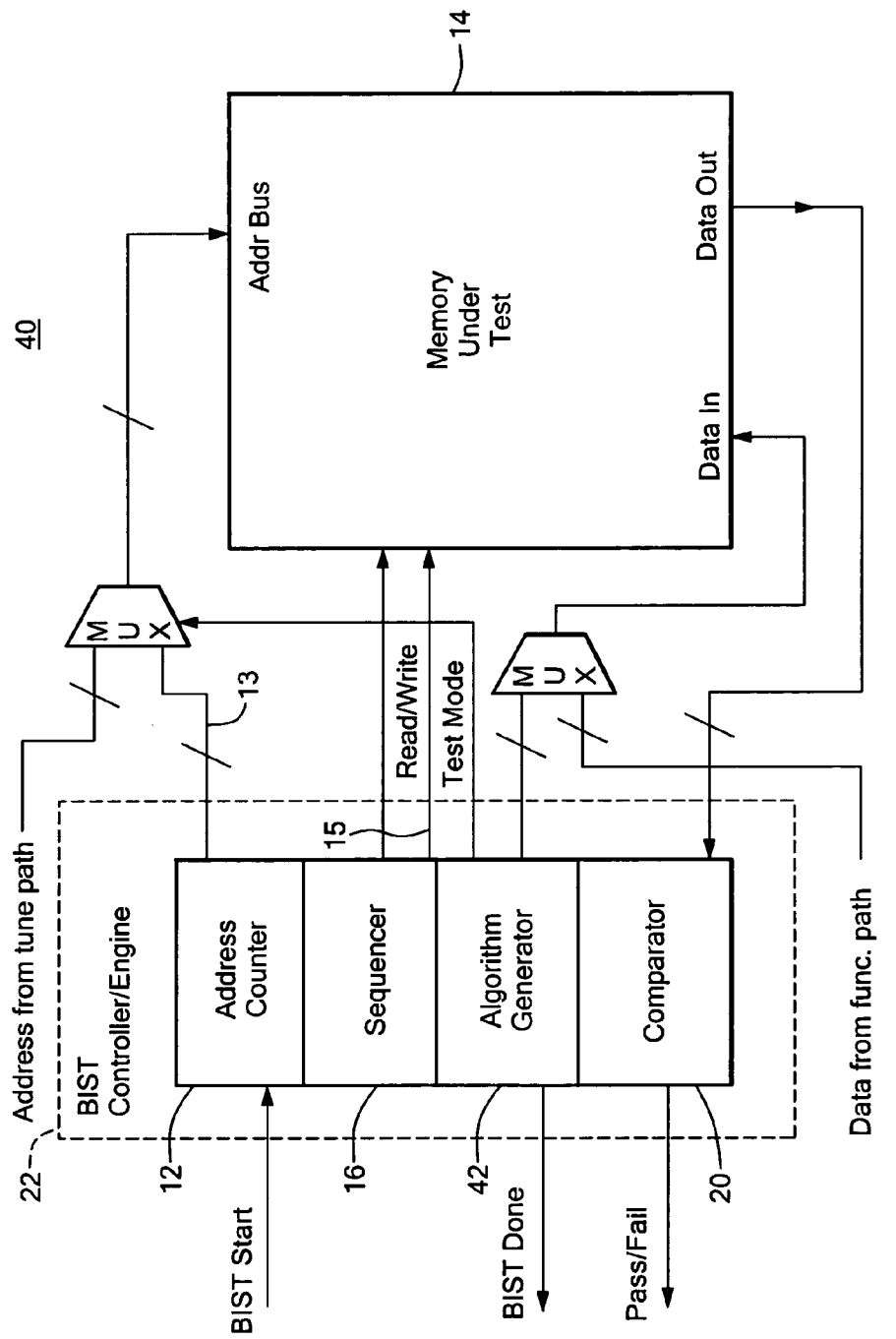

Prior art MBIST system 40, FIG. 1C, where like parts have been given like numbers, utilizes algorithmic generator 42 to generate the desired test data patterns for memory under test 14 and employs logic gates (not shown) to generate the desired test data patterns when MBIST system 40 is activated. Specific combinations of test data patterns can be generated at the time of MBIST activation by selecting various combinations of the hardwired logic for the various test data patterns. Although this design can accommodate various combinations of test patterns at the time of activation, the design is similarly limited to a predefined number of test data patterns which are hardwired with the logic gates which must be pre-programmed and hence cannot be re-programmed after MBIST system 40 is manufactured.

Figure 2:
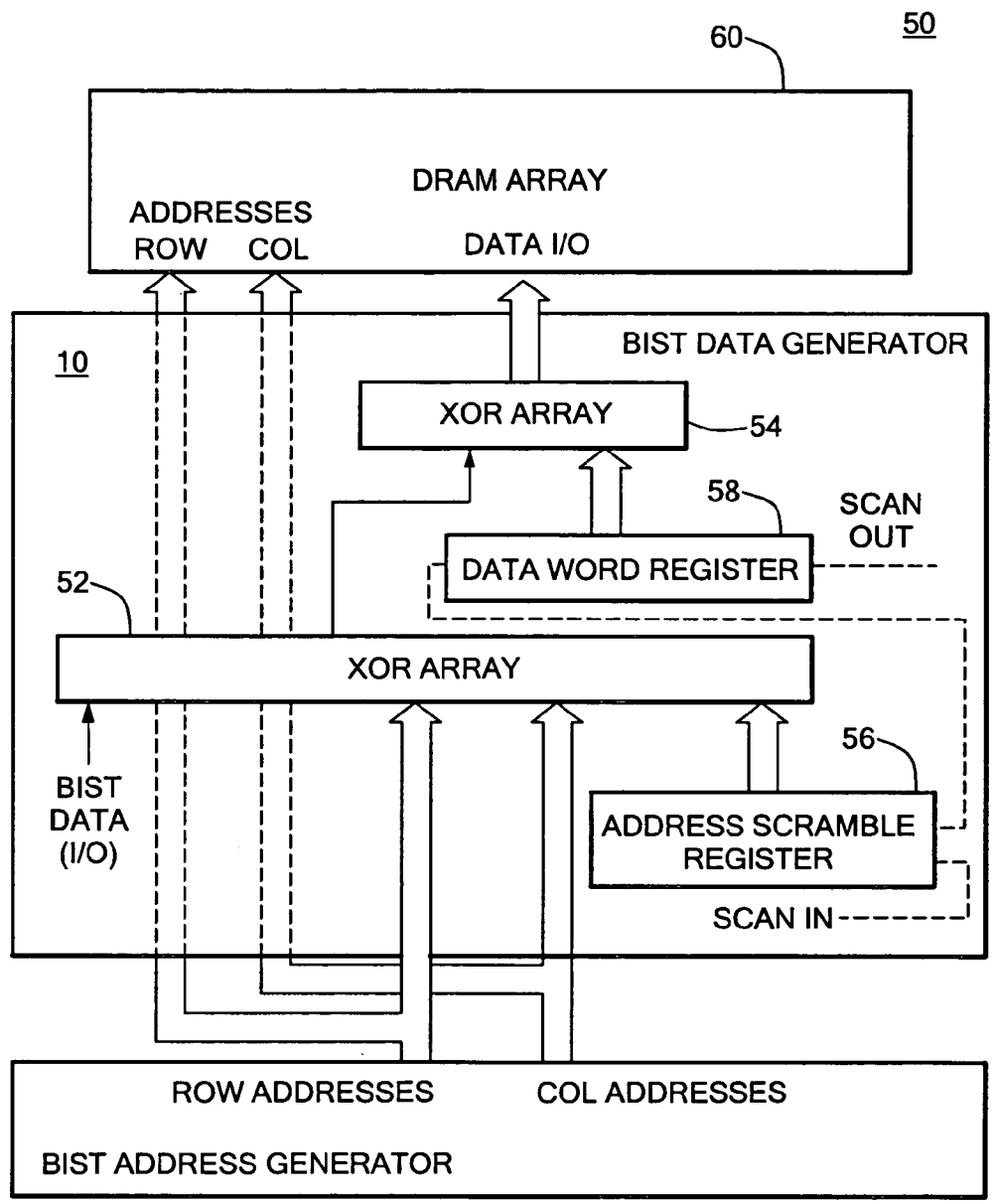
FIG. 2 is a schematic block diagram of another prior art algorithmic generation MBIST.

Prior art MBIST system 50, FIG. 2, as disclosed in U.S. Pat. No. 6,452,848, discussed above, shows a more elaborate example of a prior art algorithmic generation design. The design utilizes extensive hardwired logic, such as XOR arrays 52 and 54, address scramble register 56 and data word register 58 to provide test data patterns for testing memory 60. Although the design of prior art MBIST system 50 appears to disclose programmable memory test patterns, the design is limited to data patterns which can be generated by the extensive hardwired XOR logic arrays 52 and 54. The design also does not receive external programming of the patterns of test data. Moreover, the incorporation of address scramble register 56, data word register 58, and extensive XOR arrays 52 and 54 limit the ability of MBIST system 50 to operate at the same speed as the memory 60 being tested.

Figure 3:
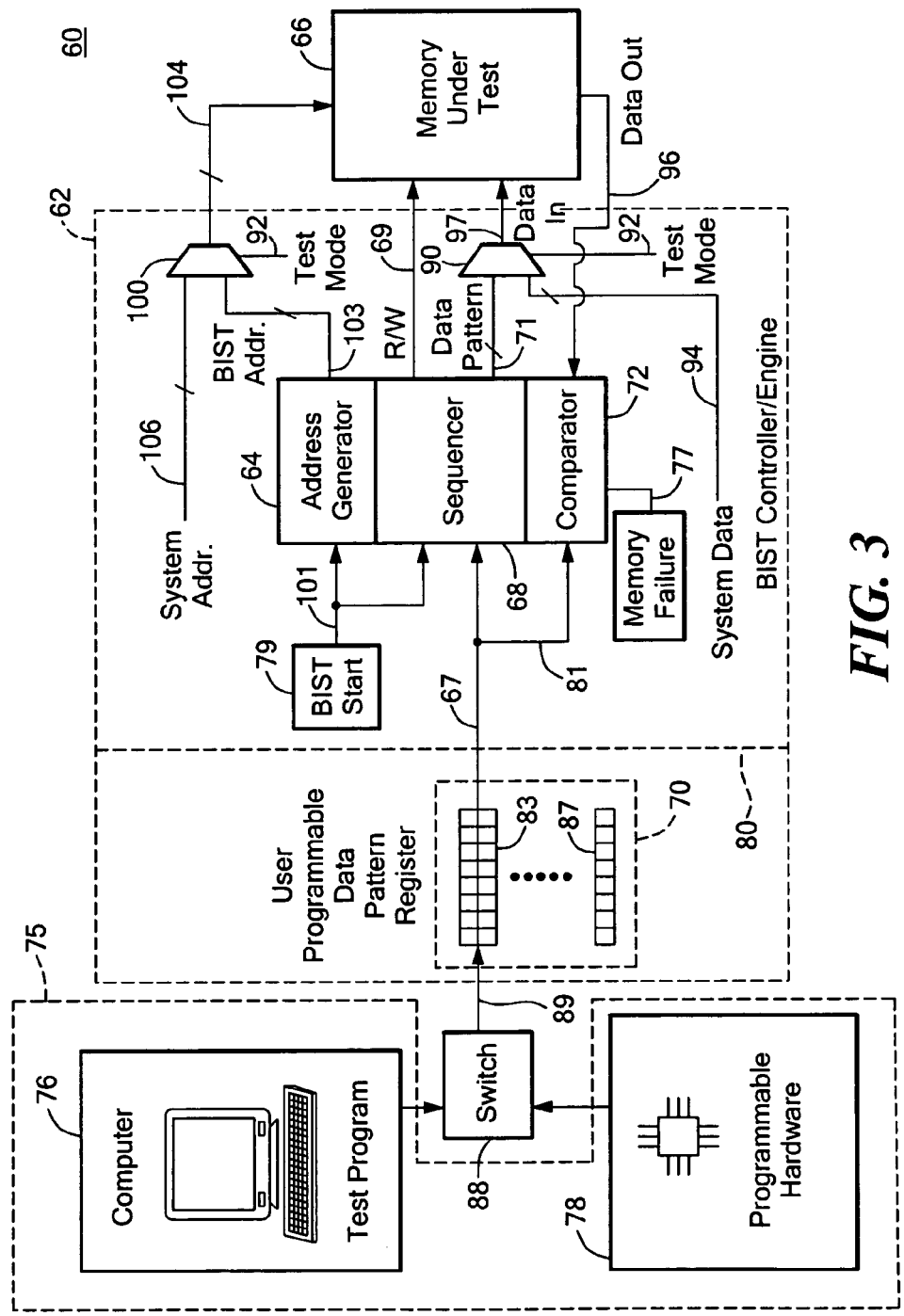
FIG. 3 is a schematic block diagram of the universally accessible fully programmable memory built-in self-test system according to this invention.

In contrast, universally accessible fully programmable memory built-in self-test (MBIST) system 60, FIG. 3 of this invention includes MBIST controller 62 with address generator 64 configured to generate addresses for memory under test 66 on line 103. MBIST controller 62 also includes sequencer circuit 68 configured to deliver test data, e.g., a pattern of test data provided by user programmable pattern register 70 on line 67 to selected addresses of memory under test 66 on line 71. Controller 62 also includes comparator circuit 72 configured to compare test data read out of memory under test 66 on line 96 to the pattern of test data on line 81 to identify and report a memory failure on line 77.

User programmable pattern register 70 provides a user defined test data pattern to memory under test 66 received by external programming device 75 (discussed in detail below). In one embodiment, user programmable pattern register 70 includes 16 bits, as shown by block 83. In other designs, user programmable pattern register 70 may include from one to N bits, where N, indicated at 87, may be 32 bits, 64 bits, 128 bits, 256 bits, or any desired number of bits as known to those skilled in the art. Although as shown in FIG. 3, user programmable pattern register 70 is located internal to MBIST controller 62, this is not a necessary limitation of this invention, as user programmable pattern register 70 may also be located external to MBIST controller 62, as indicated by dashed line 80. User programmable data pattern register 70 may serially receive the pattern of test data from external programming device 75 on line 89, or in other designs, receive the pattern of test data from external programming device 75 in a parallel configuration on line 89.

MBIST system 60 also includes external programming device 75, such as computer 76 or programmable hardware 78, configured to supply a pattern of test data to user programmable pattern register 70. Computer 76 is typically configured (e.g., programmed) to generate any user defined pattern of test data to user programmable pattern register 70. Programmable hardware 78 may also be externally programmed to generate any user defined pattern of test data. In one design, programmable hardware 78 may include automatic test equipment (not shown) which may be configured to input a user defined pattern of data. In other designs, user programmable pattern register 70 may include FLASH memory for storing a user defined pattern of test data. The FLASH memory can later be re-programmed with any other desired pattern of test data. Although as shown in FIG. 3 external programming device 75 may be a computer or programmable hardware, this is not a necessary limitation of this invention, as external programming device 75 may be any device known to those skilled in the art to supply a user defined pattern of test data to user programmable pattern register 70.

MBIST system 60 ideally includes switch 88 configured to select the various external programming devices, e.g., computer 76 and/or programmable hardware 78.

MBIST system 60 also includes multiplexor 90 where a test mode signal on line 92 selects either system data on line 94 or a pattern of test data on line 71. The test mode signal on line 92 indicates whether MBIST controller 62 is in test mode (typically provided by BIST start 99 on line 101) and if so, multiplexor 90 selects test data (e.g., a pattern of test data) on line 71 which is written to memory under test 66 on line 97. When the test mode signal on line 92 indicates MBIST system 60 is not active, the system data on line 94 is selected by multiplexor 90.

MBIST system 60 also includes multiplexor 100 where the test mode signal indicated on line 92 selects either addresses generated from address generator 64 on line 103, or system addresses on 106. Similarly, the test mode signal on line 92 determines whether MBIST system 60 is in test mode or normal system mode. When test mode signal on line 92 indicates MBIST system 60 is in test mode, multiplexor 100 selects BIST addresses from address generator 64 on line 103, which are then used to address memory under test 66 on line 104, otherwise multiplexor 100 selects system addresses on line 106.

MBIST system 60 provides the ability to externally program (e.g., external to MBIST controller 62) any user defined pattern of test data with external programming device 75. The user defined pattern of test data is written and read to memory under test 66 and comparator 72 compares the written and read pattern of test data to identify a failed memory location. The result is the elimination of the need to hardwire logic for test data patterns, utilize ROM to store numerous test data patterns, or utilize algorithmic generation techniques to generate fixed data patterns. MBIST system 60 can be reconfigured and externally programmed to produce any desired pattern of test data, such as a checkerboard or checkerboard complement test data pattern as shown in FIG. 4A, a diagonal or diagonal complement test data pattern, as shown in FIG. 4B, a byte or word wide alternating checkerboard pattern, as shown in FIG. 4C, a test pattern of walking ones, as shown in FIG. 4D, or any other patterns as needed. Although FIGS. 4A–4D show examples of several patterns of test data which may be externally programmed in accordance with this invention, this is not a necessary limitation of this invention, as any user defined pattern of data can be programmed with external programming device 75 or programmable hardware 78. Moreover, because the user defined pattern of test data provided by external programming device 75 is stored in user programmable pattern register 70 which is processed or transferred to memory under test 66 via sequencer 68, MBIST system 60 can operate at the same speed as memory under test 66.

Figure 5:
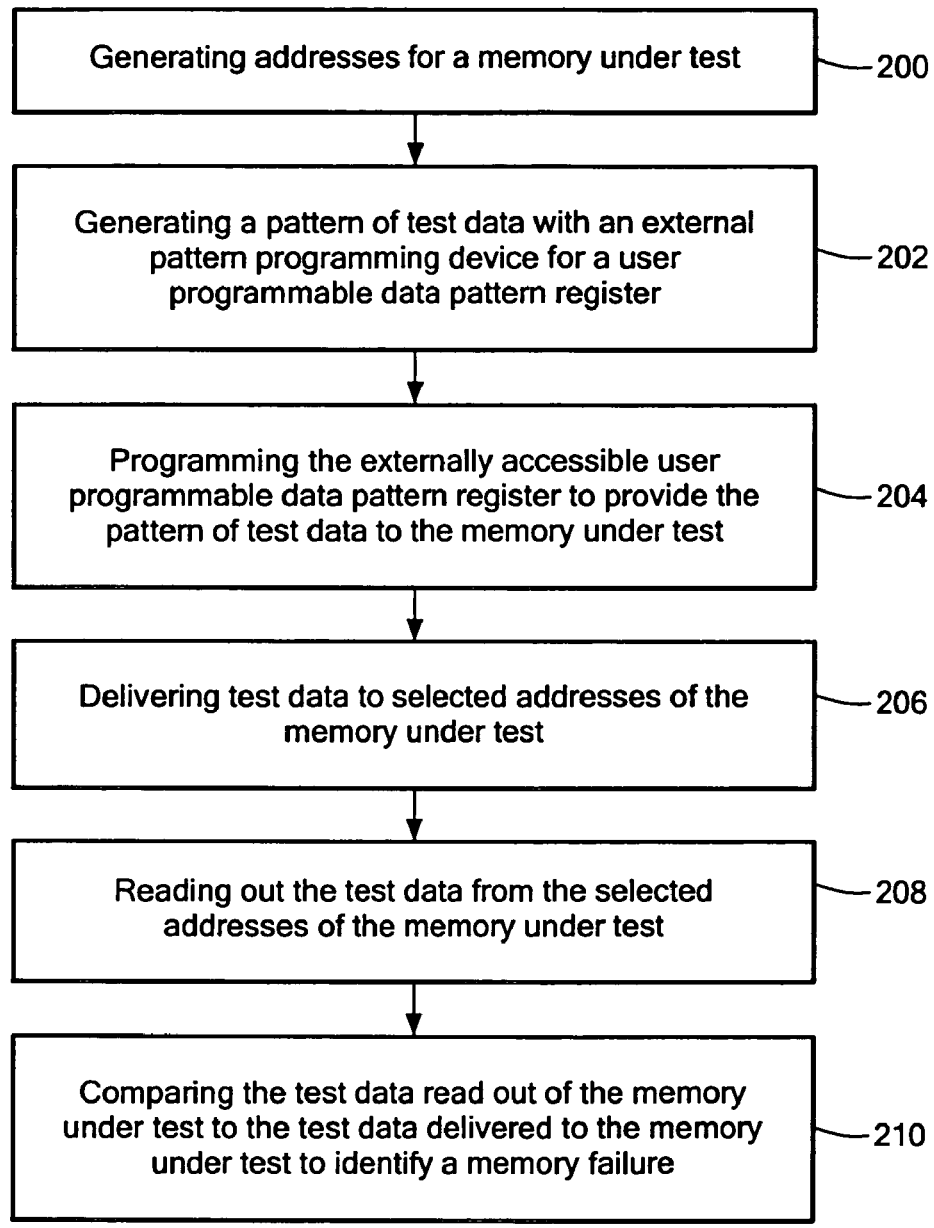
FIG. 5 is a block diagram showing the primary steps of the universally accessible fully programmable memory built-in self-test method of this invention.

The universally accessible fully programmable built-in self-test memory method 198, FIG. 5, of this invention includes the steps of generating addresses for a memory under test, step 200, generating a pattern of test data with an external pattern programming device for an externally accessible user programmable pattern register, step 202, programming the externally accessible user programmable pattern register to provide the pattern of test data to the memory under test, step 204. The programmed test data is then delivered to selected addresses of the memory under test, step 206. After that the test data is read out from the selected addresses of the memory under test, step 208 and the test data read out of the memory under test is compared to the test data delivered to the memory under test to identify a memory failure, step 210.

Other embodiments will occur to those skilled in the art and are within the following claims:

What is claimed is:

1. A universally accessible fully programmable memory built-in self-test (MBIST) system comprising:
   an MBIST controller including:
      an address generator configured to generate addresses for a memory under test;
      a sequencer circuit configured to deliver test data to selected addresses of said memory under test and reading out that test data;
      a comparator circuit configured to compare said test data read out of said memory under test to said test data delivered to said memory under test to identify a memory failure, and
      an externally accessible user programmable pattern register for providing a pattern of test data to said memory under test; and
   an external pattern programming device configured to supply a said pattern of test data to said user programmable pattern register.

2. The system of claim 1 in which said external programming device includes a computer configured to generate a user defined pattern of test data.

3. The system of claim 1 in which said external programming device includes programmable hardware configured to generate a user defined pattern of test data.

4. The system of claim 1 in which said user programmable pattern register includes FLASH memory.

5. The system of claim 1 further including a switch configured to select a computer or programmable hardware to generate a user defined pattern of data.

6. The system of claim 1 in which said user programmable pattern register serially receives said test data from said external pattern programming device.

7. The system of claim 1 in which said user programmable pattern register receives said test data from said external pattern programming device in a parallel configuration.

8. The system of claim 1 in which said user programmable pattern register includes from 1 to N bits.

9. The system of claim 1 in which said user programmable pattern register is located within said MBIST controller.

10. The system of claim 1 in which said user programmable pattern register is located external to said MBIST controller.

11. The system of claim 1 in which said pattern of test data is chosen from the group consisting of: a checkerboard pattern, a diagonal pattern, an all 0's pattern, an all 1's pattern, a walking 1's pattern, and a walking 0's pattern, and/or any combination thereof.

12. The system of claim 1 in which said pattern of test data is any defined binary data pattern limited only by the size of said user programmable data register.

13. The system of claim 1 in which said pattern of test data includes any user defined pattern of 1's and 0's.

14. The system of claim 1 further including a multiplexor where a test mode signal selects said addresses generated from said address generator or system addresses based on a predetermined state of said test mode signal.

15. The system of claim 1 further including a multiplexor where a test mode signal selects said pattern of test data or system data based on a predetermined state of said test mode signal.

16. A universally accessible fully programmable memory built-in self-test (MBIST) system, the system comprising:
   an MBIST controller including:
      an address generator configured to generate addresses for a memory under test;
      a sequencer circuit configured to deliver test data to selected addresses of said memory under test and reading out that test data, and
      a comparator circuit configured to compare said test data read out of said memory under test to said test data delivered to said memory under test to identify a memory failure;
   an externally accessible user programmable pattern register remote from said MBIST controller for providing a pattern of test data to said memory under test; and
   an external pattern programming device configured to supply said pattern of test data for said user programmable data pattern register.

17. A universally accessible fully programmable memory built-in self-test (MBIST) method, the method comprising:
   generating addresses for a memory under test;
   generating for an externally accessible user programmable pattern register a pattern of test data with an external pattern programming device;
   programming said user programmable pattern register with said pattern of test data to said memory under test;
   delivering test data to selected addresses of said memory under test;
   reading out said test data from said selected addresses of said memory under test; and
   comparing said test data read out of said memory under test to said test data delivered to said memory under test to identify a memory failure.

* * * * *